US006321075B1

(12) United States Patent
Butterfield

(10) Patent No.: US 6,321,075 B1
(45) Date of Patent: Nov. 20, 2001

(54) HARDWARE-EFFICIENT TRANSCEIVER WITH DELTA-SIGMA DIGITAL-TO-ANALOG CONVERTER

(75) Inventor: Daniel Keyes Butterfield, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/126,681

(22) Filed: Jul. 30, 1998

(51) Int. Cl.[7] .................................................. H04B 1/26

(52) U.S. Cl. ........................... 455/313; 455/110; 455/131

(58) Field of Search ................................. 455/324, 110, 455/118, 73, 131, 313, 314, 315, 84, 575; 375/271, 302, 322, 103, 105, 227, 274, 296; 327/105

(56) References Cited

U.S. PATENT DOCUMENTS

| | | | |
|---|---|---|---|
| 4,560,906 | 12/1985 | Kerekes | 315/47 |
| 5,003,621 | 3/1991 | Gailus | 455/209 |
| 5,058,107 | * 10/1991 | Stone et al. | 455/324 |
| 5,375,146 | * 12/1994 | Chalmers | 375/103 |
| 5,493,721 | 2/1996 | Reis | 455/339 |
| 5,627,499 | * 5/1997 | Gardner | 375/274 |
| 5,796,777 | * 8/1998 | Terlep et al. | 375/227 |
| 5,898,325 | * 4/1999 | Crook et al. | 327/105 |
| 5,930,301 | * 7/1999 | Chester et al. | 375/296 |
| 5,999,802 | * 10/1999 | Aschwanden | 455/324 |

FOREIGN PATENT DOCUMENTS

| | | | |
|---|---|---|---|
| 0535800 | 4/1993 | (EP) | H04B/1/40 |
| 0595781 | 5/1994 | (EP) | H04B/1/40 |

\* cited by examiner

Primary Examiner—Nay Maung
Assistant Examiner—Quochien B. Vuong
(74) Attorney, Agent, or Firm—Philip R. Wadworth; Charles D. Brown; Howard H. Seo

(57) ABSTRACT

A hardware-efficient transceiver. The transceiver includes a digital circuit for converting baseband signals to intermediate frequency signals. A signal source provides a first periodic signal of a first frequency. A direct digital synthesizer provides a second periodic signal of a second frequency from the first periodic reference signal. An upconverter circuit digitally upconverts the baseband signals to digital intermediate frequency signals using the second periodic signal A digital-to-analog converter converts the digital intermediate frequency signals to analog intermediate frequency signals using the first periodic signal. In the transceiver implementation, the digital circuit upconverts a first transmit signal from a first frequency to a second frequency in response to the second periodic signal and provides a digital transmit signal in response thereto. A second circuit is provided for converting the digital transmit signal to an analog transmit signal. Transmit and receive circuitry are provided for transmitting the analog transmit signal and receiving an analog receive signal, respectively. In a specific embodiment, the analog receive signal is digitally downconverted to provide a digital receive signal in response to a second periodic signal. A significant feature of the invention resides in the provision of the first and second periodic signals with a single local oscillator. A direct digital synthesizer is included for generating one of the reference signals from the output of the local oscillator. The transmit circuit includes a delta-sigma digital-to-analog converter having the first periodic signal as an input The delta-sigma digital-to-analog converter has a low-bit digital-to-analog converter and a delta-sigma modulator. In the illustrative embodiment, the low-bit digital-to-analog converter is a 1-bit digital-to-analog converter and the delta-sigma modulator is a sixth order delta-sigma modulator. The delta-sigma modulator includes amplifiers with approximately the following gains: 3/2, −3/4, 1/8.

62 Claims, 3 Drawing Sheets

HARDWARE-EFFICIENT TRANSCEIVER WITH DELTA-SIGMA DIGITAL-TO-ANALOG CONVERTER

BACKGROUND OF THE INVENTION

I. Field of the Invention

This invention relates to communications systems. Specifically, the present invention relates to transceivers used in communications networks.

II. Description of the Related Art

Cellular telecommunications systems are characterized by a plurality of mobile transceivers in communication with one or more base stations. Each transceiver includes a transmitter and a receiver.

In a typical transceiver, an analog radio frequency (RF) input signal, received by an antenna, is downconverted by an RF section to an intermediate frequency (IF). Signal processing circuits perform noise filtering and adjust the magnitude of the signal via analog automatic gain control (AGC) circuitry. An IF section then mixes the signal down to baseband and converts the analog signal to a digital signal. The digital signal is then input to a baseband processor for further signal processing to output voice or data.

Similarly, the transmitter receives a digital input from the baseband processor and converts the input to an analog signal. This signal is then filtered and upconverted by an IF stage to an intermediate frequency. The gain of the transmit signal is adjusted and the IF signal is upconverted to RF in preparation for radio transmission.

In both the transmit and receive sections, signal gain adjustment and mixing is typically performed in the analog domain. This necessitates the use of a plurality of local oscillators (LOs) for signal downconversion, upconversion, and mixing. Analog local oscillators tend to be bulky and require the use of one or more phase-locked loops. As is well known in the art, phaselocked loops are large, expensive circuits that consume a considerable amount of power. Hence the use of PLLs, drive up the cost, size and power consumption of analog local oscillators and the transceivers in which these circuits are employed.

Hence, a need exists in the art for a cost-effective, space-efficient transceiver with low noise characteristics and minimal power consumption.

SUMMARY OF THE INVENTION

The need in the art is addressed by the transceiver of the present invention. The inventive transceiver includes a digital circuit for converting baseband signals to intermediate frequency signals. A signal source provides a first periodic signal of a first frequency. A direct digital synthesizer provides a second periodic signal of a second frequency from the first periodic reference signal. An upconverter circuit digitally upconverts the baseband signals to digital intermediate frequency signals using the second periodic signal. A digital-to-analog converter converts the digital intermediate frequency signals to analog intermediate frequency signals using the first periodic signal.

In the transceiver implementation, the digital circuit upconverts a first transmit signal from a first frequency to a second frequency in response to the second periodic signal and provides a digital transmit signal in response thereto. A second circuit is provided for converting the digital transmit signal to an analog transmit signal. Transmit and receive circuitry are provided for transmitting the analog transmit signal and receiving an analog receive signal, respectively.

In a specific embodiment, the analog receive signal is digitally downconverted to provide a digital receive signal in response to a second periodic signal. A significant feature of the invention resides in the provision of the first and second periodic signals with a single local oscillator. A direct digital synthesizer is included for generating one of the reference signals from the output of the local oscillator.

The transmit circuit includes a delta-sigma digital-to-analog converter having the first periodic signal as an input. The delta-sigma digital-to-analog converter has a low-bit digital-to-analog converter and a delta-sigma modulator.

In the illustrative embodiment, the low-bit digital-to-analog converter is a 1-bit digital-to-analog converter and the delta-sigma modulator is a sixth order delta-sigma modulator. The delta-sigma modulator includes amplifiers with approximately the following gains: 3/2, −3/4, 1/8.

The transmit circuit includes a digital automatic gain control circuit for adjusting the gain of the first signal. An output of the automatic gain control circuit is input to the delta-sigma digital-to-analog converter. Also, a digital low-pass filter, a digital mixer, and a digital adder are included in the transmit circuit An output of the digital adder provides an input to the automatic gain control circuit.

The novel design of the present invention is facilitated by the elimination of a local oscillator via the use of the direct digital synthesizer and the delta-sigma digital-to-analog converter. By eliminating a local oscillator, power and space savings are achieved.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The following review of a traditional transceiver is intended to facilitate an understanding of the present invention.

Figure 1:
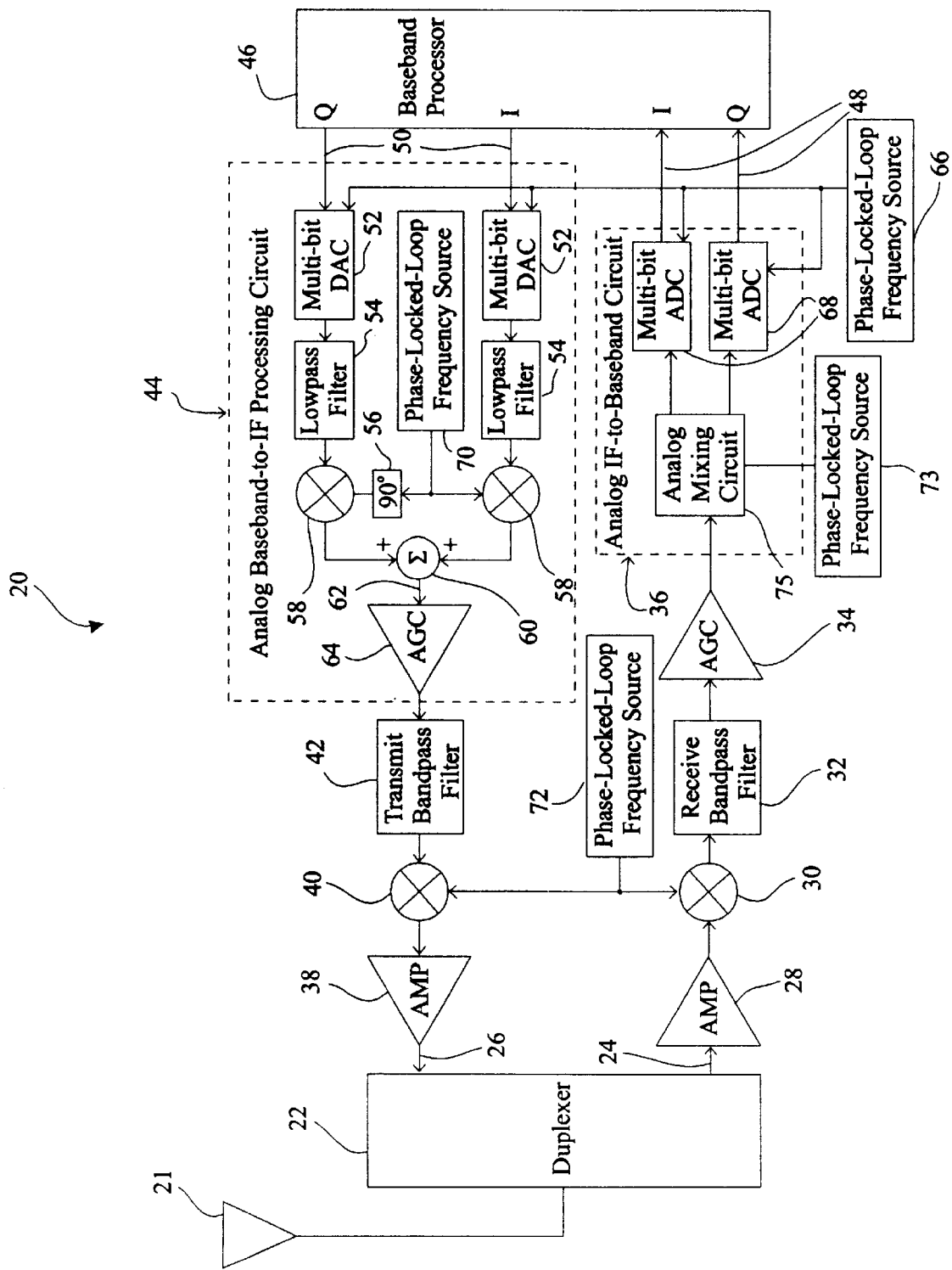
FIG. 1 is a block diagram of a prior art transceiver.

FIG. 1 is a block diagram of a prior art transceiver 20. The transceiver 20 is a dual conversion telecommunications transceiver and includes an antenna 21 for receiving and transmitting RF signals. A duplexer 22 connected to the antenna 21 facilitates the separation of receive RF signals 24 from transmit RF signals 26.

The receive RF signals 24 enter a receive circuit that includes a receive RF amplifier 28, an RF-to-IF mixer 30, a receive bandpass filter 32, an analog receive automatic gain control (AGC) circuit 34, and an analog IF-to-baseband processing circuit 36. The receive RF signals 24 are amplified by the receive amplifier 28, mixed to intermediate frequencies via the RF-to-IF mixer 30, filtered by the receive bandpass filter 32, gain-adjusted by the receive AGC 34, and then converted to digital baseband signals 48 via the analog IF-to-baseband processing circuit 36. The digital baseband signals 48 are then input to a digital baseband processor 46.

The RF transmit signals 26 arrive at the duplexer 22 from a transmit circuit that includes a transmit RF amplifier 38, an IF-to-RF mixer 40, a transmit bandpass filter 42, and analog baseband-to-IF processing circuit 44. Digital baseband processor output signals 50 are received by the analog baseband-to-IF processing circuit 44 where they are converted to analog signals, mixed to IF signals that are then filtered by the transmit bandpass filter 42, mixed up to RF by the IF-to-RF mixer 40, amplified by the transmit amplifier 38 and then transmitted via the duplexer 22 and the antenna 21.

Both receive and transmit circuits are connected to the digital baseband processor 46 that processes the received baseband digital signals 48 and outputs the digital baseband processor output signals 50. The baseband processor 46 may include such functions as signal to voice conversions and/or vise versa.

The baseband processor output signals 50 are 90° out of phase with respect to each other and correspond to in-phase (I) and quadrature (Q) signals. The output signals 50 are input to digital-to-analog converters (DACs) 52 in the analog baseband-to-IF processing circuit 44 where they are converted to analog signals that are then filtered by lowpass filters 54 in preparation for mixing. The signals' phases are adjusted, mixed, and summed via a 90° shifter 56, baseband-to-IF mixers 58, and adder 60, respectively. The adder 60 outputs IF signals 62 that are input to an analog transmit automatic gain control (AGC) circuit 64 where the gain of the mixed IF signals 62 is adjusted in preparation for filtering via the transmit bandpass filter 42, mixing up to RF via the IF-to-transmit mixer 40, amplifying via the transmit amplifier 38, and eventual radio transmission via the duplexer 22 and the antenna 21.

The DACs 52 in the baseband-to-IF processing circuit 44 are docked by a first local oscillator (LO1) 66. The sampling rate of the DACs 52 is determined by the frequency of the local oscillator 66. The local oscillator 66 also provides the dock signal to the analog IF-to-baseband processing circuit 36, which is used by analog-to-digital converters (ADC) 68 in the analog IF-to-baseband processing circuit 36.

A second local oscillator (LO2) 70 is required by the mixers 58 in the analog-to-baseband processing circuit 44. The second local oscillator 70 outputs a clock signal having a different frequency than the output of the first local oscillator 66. Typically, the second local oscillator 70 operates at a much higher frequency than the first local oscillator 66.

A third local oscillator 72 is required for the operation of the receive RF-to-IF mixer 30 and the transmit IF-to-RF mixer 40 Typically the same local oscillator 72 is used for both mixers 30, 40.

A fourth local oscillator 73 is used by an analog mixing circuit 75 in the analog IF-to-Baseband circuit 36 to facilitate IF-to-baseband processing functions performed by the analog mixing circuit 75.

All of the local oscillators 66, 70, 72, 73 require one or more phaselocked. loops (PLLs). PLLs are typically large analog circuits that consume excess power.

Design limitations of the transceiver 20 limit the amount of signal processing that can be performed in the digital domain, and require the use of additional large analog power-consuming circuits such as local oscillators and analog AGCs. For example, the multi-bit DACs 52 are implemented before the analog signal mixing and filtering performed by the baseband-to-IF-processing circuit 44. This is partly because the DACs 52 would generate an extraordinary amount of spurious noise if they were implemented after mixing. This is because the IF signals 62 are higher frequency signals that magnify converter glitches thereby increasing spurious noise. The spurious noise is typically in-band and is difficult to filter via conventional means.

Since the digital-to-analog conversion must take place before baseband-to-IF conversion by the circuit 44, the baseband-to-IF processing circuit 44 must be implemented in the analog domain. The analog mixers 58, filters 54, adder 60, and the analog AGC 64 are much larger and consume more power than their digital counterparts. Furthermore, imbalances due to low precision of analog circuits causes feedthrough of the oscillator signal 70, which cannot be filtered by practical means.

In addition, the design of the transceiver 20 necessitates the use of at least three local oscillators, i.e., the first local oscillator 66, the second local oscillator 70 and the third local oscillator 72. The oscillators 66, 70, and 72 include large, power-inefficient analog PLLs.

Figure 2:
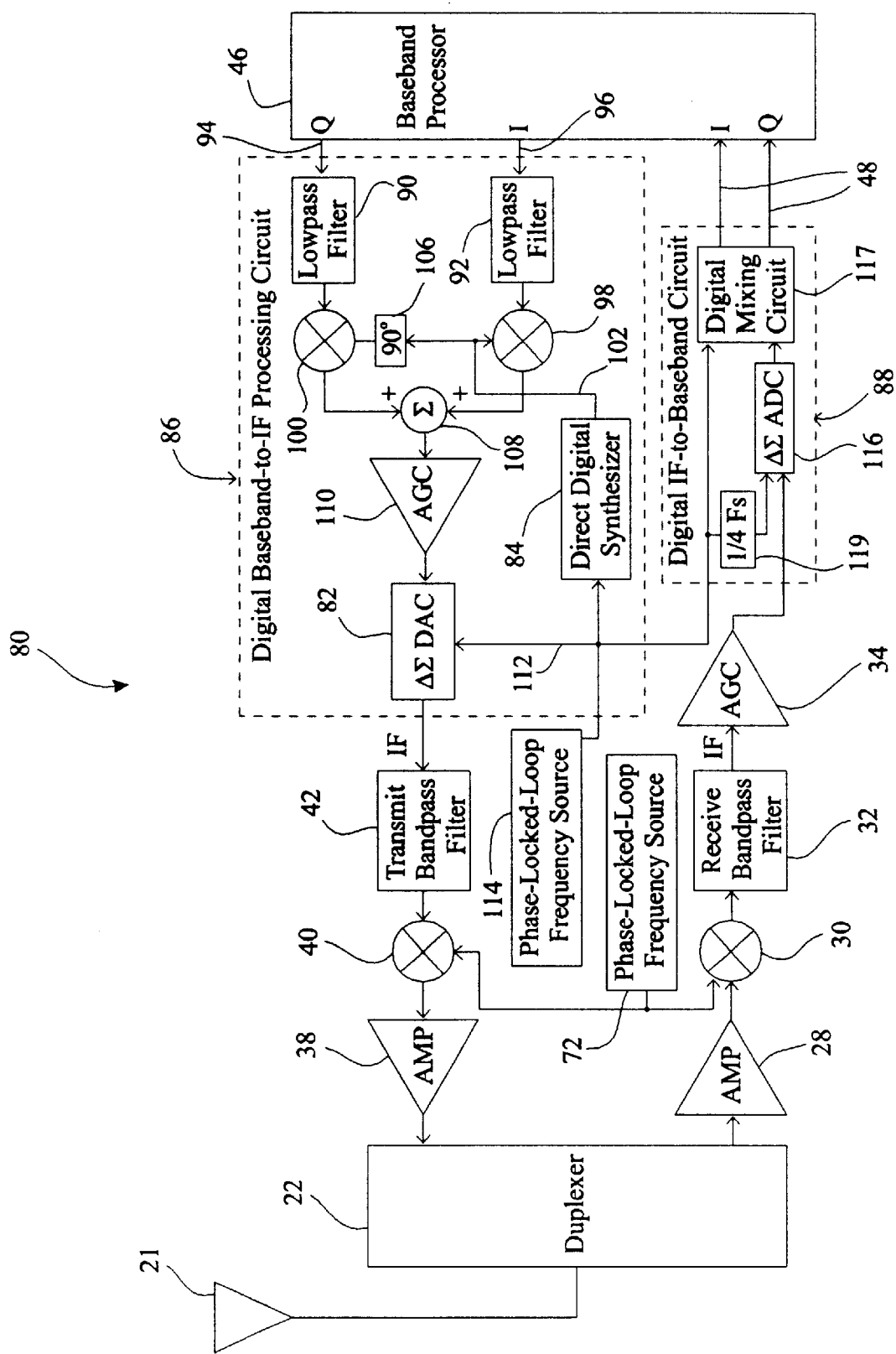
FIG. 2 is a block diagram of a transceiver constructed in accordance with the teachings of the present invention and employing a delta-sigma (ΔΣ) digital-to-analog converter (DAC) and a direct digital synthesizer (DDS).

FIG. 2 is a block diagram of a transceiver 80 constructed in accordance with the teachings of the present invention. The transceiver 80 employs a delta-sigma ($\Delta\Sigma$) digital-to-analog converter (DAC) 82 and a direct digital synthesizer (DDS) 84. In the transceiver 80, the analog baseband-to-IF processing circuit 114 of FIG. 1 and the analog IF-to-baseband processing circuit 36 of FIG. 1 are replaced with a re-designed baseband-to-IF processing circuit 86, and re-designed IF-to-baseband processing circuit 88, respectively. The replacements eliminate the need for the second local oscillator 70 of FIG. 1, greatly reducing transceiver power consumption and size.

The $\Delta\Sigma$ DAC 82 can convert digital IF signals to analog signals without the spurious noise problems of a multi-bit DAC. By employing the $\Sigma\Delta$ DAC 82, baseband-to-IF signal processing may be performed in the digital domain, thus eliminating oscillator feedthrough.

The digital baseband-to-IF processing circuit 86 includes a first digital lowpass filter 90 and a second digital lowpass filter 92 that filter undesirable signals such as noise from quadrature (Q) 94 and in-phase (I) 96 signals received from the baseband processor 46, respectively. The filtered in-phase signals are input to a first digital mixer 98, while the filtered quadrature signals are input to a second digital mixer 100. The first mixer 98 is clocked by a DDS clock signal 102 from the DDS 84. The DDS clock signal 102 is shifted in phase by 90° by a digital phase shifter 106, providing a shifted clock signal 104 in response thereto. By clocking the mixers 98, 100 with clock signals that are 90° out of phase, the I and Q signals are brought in phase. The mixers 98, 100 convert the I and Q signals to IF signals that are combined via a digital adder 108. The added IF signals are then output to a digital AGC 110, the construction of which is well known in the art. The digital AGC 110 adjusts the gain of the IF signals and outputs these signals to the $\Delta\Sigma$ DAC 82. The $\Delta\Sigma$ DAC 82 converts these signals to analog signals in preparation for more filtering by the bandpass filter 42, mixing up to radio frequencies by the mixer 40, amplifying by the amplifier 38 and transmitting via the duplexer 22 and then antenna 21.

The ΔΣ DAC 82 utilizes an oscillator signal 112 generated by a single local oscillator 114 to drive a 1-bit DAC included in the ΔΣ DAC 82 (as discussed more fully below). The oscillator signal 112 is also used as a frequency control signal to drive the DDS 84 that synthesizes the DDS clock signal 102. The DDS clock signal 102 has a different frequency than the oscillator signal 112.

The DDS 84 produces a digitized sinusoidal signal corresponding to the dock signal 102 from the oscillator signal 112 by accumulating phase increments of the digitized sinusoidal signal 102 at the higher rate of the oscillator signal 112. The accumulated phase is converted to the digitized sinusoidal signal 102 via a look-up table (not shown). The digitized sinusoidal signal 102 is used as a frequency reference by the mixers 98, 100 to translate the baseband signals 94, 96 to IF.

Construction of the DDS 84 is known in the art and described in U.S. Pat. No. 4,965,533, entitled DIRECT DIGITAL SYNTHESIZER DRIVEN PHASE LOCK LOOP FREQUENCY SYNTHESIZER, assigned to the assignee of the present invention and incorporated herein by reference.

Those skilled in the art will appreciate that the DDS 84 may be implemented as a programmable DDS whose output clock signal 102 is adjustable in response to transmission or reception errors due to oscillator frequency drift and/or other related errors. Such error measurements may be detected by logic in the baseband processor 46 or via additional error detection circuits (not shown).

Use of the DDS 84 to generate the DDS clock signal 102 eliminates the need for an additional local oscillator with an additional PLL. The DDS 84 is much smaller than a local oscillator and PLL and may be readily implemented in a compact very large scale integration (VLSI) circuit along with the digital mixers 98, 100, filters 90, 92, adder, 108, AGC 110, and ΔΣ DAC 82. In addition, the DDS 84 consumes relatively small amounts of power. Also, use of the low noise ΔΣ DAC 82 eliminates the need for an additional multi-bit DAC as is required in the transceiver 20 of FIG. 1.

With reference to FIGS. 1 and 2, the separate PLL oscillator 70 required in the conventional transceiver 20 for baseband-to-IF conversion is replaced, in the transceiver 80 of the present invention by the digital DDS 84. The performance of the baseband-to-IF processing circuit 44 of FIG. 1 is improved upon, in the present invention. In the present invention, analog processing functions are implemented in digital circuits and the spurious multi-bit DACs 52 are replaced with the 1-bit sigma-delta DAC 82.

In the present specific embodiment, the oscillator signal 112 is also used to clock a digital IF-to-baseband processing circuit 88 in the receive circuit. In the present specific embodiment, the digital IF-to-baseband processing circuit 88 that includes a high-speed ΔΣ analog-to-digital converter (ADC) 116, a digital mixing circuit 117, and a frequency multiplier for converting the frequency of the oscillator signal 112 to a second frequency for use by the ΔΣ ADC 116. The construction of ΔΣ ADCs, digital mixing circuits, and frequency multipliers is well known in the art.

In the present embodiment, the frequency multiplier 117 divides the frequency (Fs) of the oscillator signal 112 by four and provides the resulting divided oscillator signal as a clock to a 1-bit ADC (not shown) included in the ΔΣ ADC 116.

The oscillator signal 112 provides a reference frequency to the digital mixing circuit 117 for use by the digital mixing circuit 117 to downconvert digital IF signals output from the ΔΣ ADC 116 to the baseband signals 48.

Those skilled in the art will appreciate that digital downconversion functions performed in the digital IF-to-baseband processing circuit 88 may be implemented in a manner similar to upconversion functions performed in the digital baseband-to-IF processing circuit 86. Also, the analog AGC 34 may be implemented as a digital AGC after the ΣΔ ADC 116 in the digital IF-to-baseband circuit 88.

Construction of the receive circuit may be implemented in accordance with the teachings of U.S. patent application Ser. No. 6,005,506, filed Dec. 9, 1997, by Bararjani et al., entitled RECEIVER WITH DELTA-SIGMA ANALOG-TO-DIGITAL CONVERTER, assigned to the assignee of the present invention and incorporated by reference herein.

Those skilled in the art will appreciate that digital IF-to-baseband processing circuit 86 may be replaced with a different version, such as the analog IF-to-baseband processing circuit 36 of FIG. 1 without departing from the scope of the present invention. Also, the DDS 84 of the digital baseband-to-IF processing circuit 86 may be implemented in the IF-to-baseband processing circuit 88 in addition to or instead of being implemented in the digital baseband-to-IF processing circuit 86. That is, the DDS output 102 may be used by downconversion circuitry and/or ADCs in the IF-to-baseband processing circuit 88. In addition, the AGC circuit 110 may be implemented in the analog domain after the ΔΣ DAC 82 without departing from the scope of the present invention.

Figure 3:
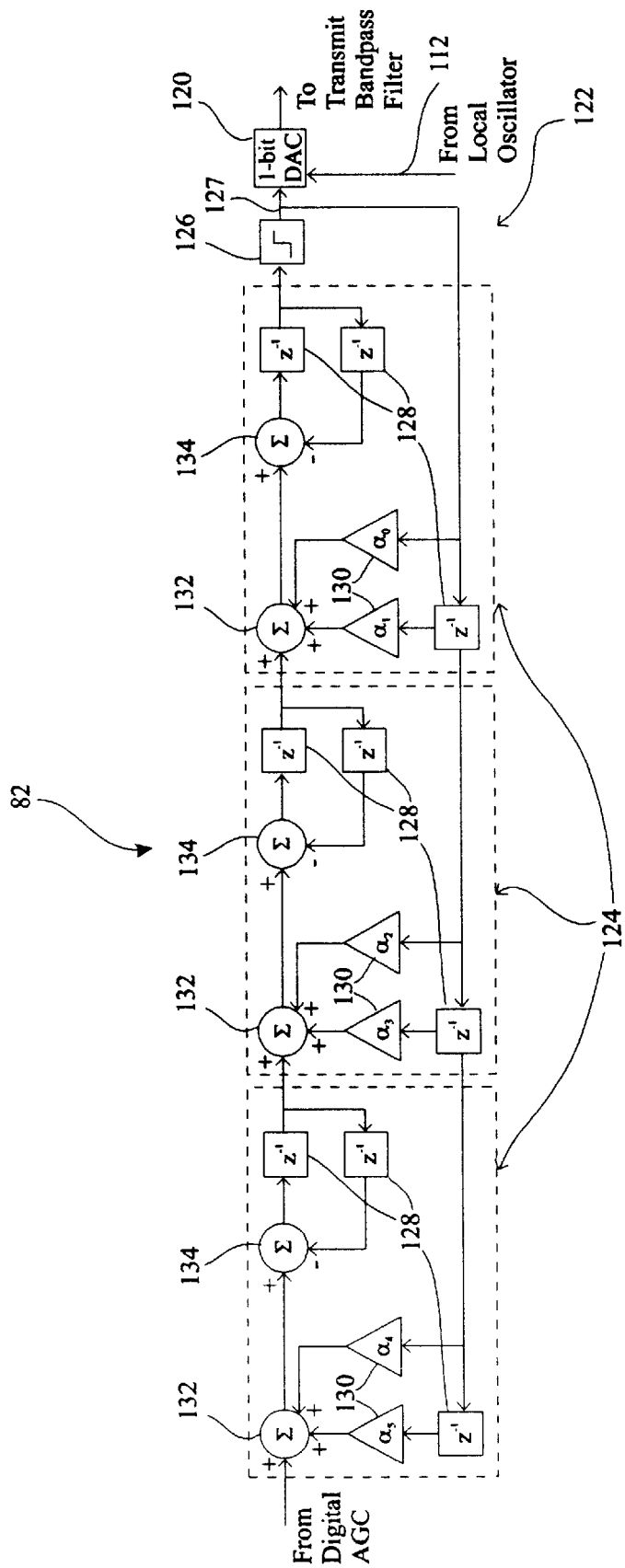
FIG. 3 is a block diagram of the ΔΣ DAC of FIG. 2.

FIG. 3 is a block diagram of the ΔΣ DAC 82 of FIG. 2. The ΔΣ DAC 82 includes a 1-bit DAC 120 at the output of a ΔΣ modulator 122. The ΔΣ modulator 122 is a sixth order ΔΣ modulator. The ΔΣ modulator 82 has three basic building blocks 124, also termed second order resonators, cascaded together. Each basic building block 124 includes a combination of digital delays ($z^{-1}$) 128, amplifiers 130 having voltage gains $\alpha_i$ (where i is an integer index ranging from 0 to 5), an adder 132, and a subtractor 134. The adder 132 receives as parallel inputs, outputs from the amplifiers 130. One of the amplifiers 130 has an input provided by a digital delay 128 whose input is also the input of the other amplifier 130. This input is provided by a digital delay 128 in a subsequent resonator 124, or, in the case of the output basic block 124, provided by the noise-shaped output 127 of the ΔΣ modulator 82.

The first basic building block 124 receives the output of the digital AGC 110 of FIG. 2 as a third input to the adder 132. Subsequent building blocks 124 receive outputs of the previous basic building blocks 124 as third inputs to the adders 132.

Those skilled in the art will appreciate that methods for constructing the basic building blocks 124 are well known in the art and may be implemented using programmable gate arrays.

The output of the adder 132 provides an input to the subtractor 134. The output of the adder 132 is sent through a digital delay 128, providing the output of the resonator 124. The output of the resonator 124 is sent through another digital delay 128 and provides a second input to the adder 132 forming a feedback loop.

Quantization noise is modeled as a linear noise element 126 and occurs before the noise shaped output 127.

The voltage gains of the amplifiers 130 are picked to provide a noise transfer function and signal transfer function that enable the ΔΣ modulator 82 to meet stability noise shaping requirements for a particular application. Methods for picking of the gains α for the amplifiers 130 are well known in the art. In the present specific embodiment, the gains are: $\alpha_0=0$, $\alpha_1=3/2$, $\alpha_2=0$, $\alpha_3=-3/4$, $\alpha_4=0$, $\alpha_5=1/8$.

The 1-bit DAC 120 is clocked by the oscillator signal 112 of FIG. 2. Those skilled in the art will appreciate that the 1-bit DAC 120 may be replaced by a low-bit DAC such as a 2 or 3 bit DAC without departing from the scope of the present invention. The constructions of sigma-delta DACs and ADCs are well known in the art.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A digital circuit for converting baseband signals to intermediate frequency signals comprising:
    a signal source for providing a first periodic signal of a first frequency;
    frequency synthesizing means for providing a second periodic signal of a second frequency from said first periodic signal;
    upconverting means for digitally upconverting baseband signals to digital intermediate frequency signals using said second periodic signal; and
    digital-to-analog converter means for converting said digital intermediate frequency signals to analog intermediate frequency signals using said first periodic signal.

2. The invention of claim 1 wherein said signal source includes a voltage controlled oscillator.

3. The invention of claim 1 wherein said frequency synthesizing means is a digital circuit.

4. The invention of claim 3 wherein said frequency synthesizer means includes a direct digital synthesizer.

5. The invention of claim 1 wherein said upconverting means includes a digital filter for removing undesirable signals from said baseband signals and/or said intermediate frequency signals.

6. The invention of claim 1 wherein said upconverting means includes first and second digital mixers.

7. The invention of claim 1 wherein said upconverting means includes a digital automatic gain control circuit.

8. The invention of claim 1 wherein said digital-to-analog converter means includes a delta-sigma digital-to-analog converter.

9. The invention of claim 8 wherein said delta-sigma digital-to-analog converter includes a delta-sigma modulator having an order greater than two.

10. The invention of claim 9 wherein said delta-sigma modulator is a sixth order delta-sigma modulator.

11. The invention of claim 8 wherein said delta-sigma digital-to-analog converter includes a low-bit digital-to-analog converter.

12. The invention of claim 11 wherein said digital-to-analog converter is a 1-bit digital to analog converter.

13. The invention of claim 1 wherein said direct digital synthesizer is a programmable direct digital synthesizer.

14. A digital circuit for converting intermediate frequency signals to baseband signals comprising:
    a signal source for providing a first periodic signal of a first frequency;
    frequency synthesizing means for providing a second periodic signal of a second frequency from said first periodic signal;
    downconverting means for digitally downconverting analog intermediate frequency signals to digital baseband signals using said second periodic signal; and
    analog-to digital converter means for converting said analog intermediate frequency signals to digital intermediate frequency signals using said first periodic signal.

15. The invention of claim 14 wherein said signals source includes a voltage controlled oscillator.

16. The invention of claim 14 wherein said frequency synthesizing means includes a frequency multiplier.

17. The invention of claim 14 wherein said frequency synthesizing means is a digital circuit.

18. The invention of claim 17 wherein said frequency synthesizing means includes a direct digital synthesizer.

19. The invention of claim 14 wherein said downconverting means includes digital mixers.

20. The invention of claim 14 wherein said analog-to-digital converter means includes a delta-sigma analog-to-digital converter.

21. A transceiver comprising:
    a receive circuit;
    a transmit circuit;
    a baseband processor connected to said receive circuit and said transmit circuit;
    a digital circuit in said transmit circuit for converting baseband signals from said baseband processor to digital intermediate frequency signals; and
    a delta-sigma digital-to-analog converter in said transmit circuit for converting said digital intermediate frequency signals to analog intermediate frequency signals.

22. The invention of claim 21 further including a signal source for providing a first periodic signal of a first frequency for input to said delta-sigma digital-to-analog converter.

23. The invention of claim 22 further including a direct digital synthesizer for converting said first periodic signal to a second periodic signal of a second frequency, said second periodic signal input to said digital circuit.

24. A transceiver comprising:
    first means for digitally upconverting a first signal from a first frequency to a second frequency in response to a first reference signal and providing a first digital signal in response thereto;
    second means for converting said first digital signal at said second frequency to a first analog signal;
    third means for transmitting said first analog signal;
    fourth means for receiving a second analog signal;
    fifth means for digitally downconverting said second analog signal to a second digital signal in response to a second reference signal; and
    a phase-locked loop for providing said first and said second reference signals.

25. The invention of claim 24 further including a direct digital synthesizer having the output of a local oscillator as an input and providing said first reference signal as an output thereof.

26. The invention of claim 24 further including a direct digital synthesizer having the output of a said local oscillator as an input and providing said second reference signal as an output thereof.

27. A transceiver comprising:
    first means for generating a first periodic signal of a first frequency;

second means for digitally generating a second signal of a second frequency from said first periodic signal;

third means for using said first periodic signal to perform digital-to-analog conversion or analog to-digital conversion of signals in a transmit circuit or a receive circuit of said transceiver, said third means including a delta-sigma modulator; and fourth means for utilizing said second signal for an additional circuit in said transceiver and/or said receiver, said additional circuit requiring a clock signal or reference frequency control signal, said clock signal or said reference frequency control signal provided by said second signal.

28. The invention of claim 27 wherein said first means includes an oscillator.

29. The invention of claim 27 wherein said second means includes a direct digital synthesizer.

30. The invention of claim 27 wherein said third means includes a low-bit delta-sigma digital-to-analog converter.

31. The invention of claim 30 wherein said low-bit delta-sigma digital-to-analog converter is a 1-bit digital-to-analog converter.

32. The invention of claim 27 wherein said delta-sigma modulator is a sixth order delta-sigma modulator.

33. A transceiver comprising:

means for generating a first periodic signal of a first frequency;

means for receiving an analog signal, said receiving means including means for utilizing said first periodic signal to convert said received analog signal to a digital signal;

means for digitally processing said received signal and for providing a first transmit signal;

means for transmitting said first transmit signal, said means for transmitting including means for utilizing said first periodic signal to convert said first transmit signal from digital to analog; and means for driving digital circuitry in said means for transmitting and/or said means for receiving with said first periodic signal.

34. The invention of claim 33 wherein said means for driving includes a direct digital synthesizer for converting said first periodic signal of a first frequency to a second periodic signal of a second frequency, said second periodic signal provided as input to a digital circuit included in said digital circuitry.

35. The invention of claim 34 wherein said digital circuit is a digital mixer.

36. The invention of claim 33 wherein said digital circuitry includes a direct digital synthesizer for generating a second periodic signal from said first periodic signal for use by signal mixing circuitry in said transmitting means.

37. The invention of claim 32 wherein said means for transmitting includes a delta-sigma digital-to analog converter, said digital-to-analog converter having said first periodic signal as an input.

38. The invention of claim 37 wherein said delta-sigma digital-to-analog converter includes a low-bit digital-to-analog converter and a delta-sigma modulator.

39. The invention of claim 38 wherein said low-bit digital-to-analog converter is a 1-bit digital-to-analog converter.

40. The invention of claim 38 wherein said delta-sigma modulator is a sixth order delta-sigma modulator.

41. The invention of claim 40 wherein said delta-sigma modulator includes amplifiers with approximately the following gains: 3/2, −3/4, 1/8.

42. The invention of claim 32 wherein said means for transmitting includes a digital automatic gain control circuit for adjusting the gain of said first transmit signal.

43. The invention of claim 42 wherein an output of said automatic gain control circuit is input to said delta-sigma analog-to digital converter.

44. The invention of claim 43 wherein said means for transmitting includes a digital lowpass filter, a digital mixer, and a digital adder, for providing an input to said automatic gain control circuit.

45. The invention of claim 32 wherein said means for receiving includes a delta-sigma analog-to-digital converter.

46. The invention of claim 45 wherein said means for receiving includes a frequency multiplier receiving said first periodic signal as an input and providing a frequency-adjusted signal in response thereto.

47. The invention of claim 46 wherein said frequency-adjusted signal has a frequency that is approximately $\frac{1}{4}^{th}$ of the frequency of said first periodic signal.

48. The invention of claim 46 wherein said delta-sigma analog-to-digital converter receives said frequency-adjusted signal as an input.

49. The invention of claim 32 wherein said means for generating includes a voltage controlled oscillator.

50. The invention of claim 32 wherein said means for processing includes a baseband processor.

51. A high performance, space-efficient and power-efficient transceiver comprising:

antenna means for receiving and transmitting radio frequency signals;

first translating means for translating said radio frequency signals to intermediate frequency signals and vice versa;

second translating means for translating said intermediate frequency signals to baseband signals and vice versa, said second translating means having a single local oscillator;

filtering means for removing undesirable signals from said baseband signals and said intermediate frequency signals;

gain control means in communication with said filtering means for adjusting the gain of said baseband signals and said intermediate frequency signals to facilitate signal processing; and means for processing said baseband signals in accordance with predetermined transceiver instructions.

52. The invention of claim 51 wherein said second translating means performs said translation with a digital mixing circuit.

53. The invention of claim 52 wherein said second translating means includes a direct digital synthesizer for generating a clock signal of a different frequency than that output by said first local oscillator.

54. The invention of claim 51 wherein said gain control means includes a digital automatic gain control circuit in communication with said mixing circuit.

55. The invention of claim 51 wherein said means for processing is a cellular telephone baseband processor.

56. The invention of claim 51 wherein said filtering means includes a transmit bandpass filter, a receive bandpass filter, and at least one lowpass filter.

57. The invention of claim 51 wherein said first translating means includes a first local oscillator.

58. A high performance, hardware-efficient transceiver comprising:

antenna means for receiving receive signals and transmitting transmit signals;

oscillator means for generating a first periodic signal;

a signal processor for processing transmitted signals and received signals;

a receive circuit having a first analog-to-digital converter having said first periodic signal as an input for converting said receive signals to baseband signals, said baseband signals input to said signal processor;

a transmit circuit having a mixing circuit for mixing transmit baseband signals received from said signal processor to intermediate frequency band signals;

a direct digital synthesizer for synthesizing a second periodic signal from said first periodic signal for clocking said mixing circuit;

a first digital-to-analog converter in said transmit circuit having said first periodic signal as an input for converting signals of said intermediate frequency band to analog signals; and a translating circuit for translating said intermediate frequency band signals to a frequency band suitable for broadcast and generating said transmit signals in response thereto.

59. A digital circuit for translating signals between an intermediate frequency band and baseband comprising:

a local oscillator for providing a first periodic signal of a first frequency;

a delta-sigma converter for converting analog signals to digital signals and/or vice versa using said first periodic signal;

a direct digital synthesizer for providing a second periodic signal based on said first periodic signal, said second periodic signal having a second frequency; and mixing means for translating said digital signals and/or said analog signals between said intermediate frequency band and said baseband using said second periodic signal.

60. A method for transmitting and receiving signals including the steps of:

digitally upconverting a first signal from a first frequency to a second frequency in response to a first reference signal and providing a first digital signal in response thereto;

converting said first digital signal at said second frequency to a first analog signal;

transmitting said first analog signal;

receiving a second analog signal;

digitally downconverting said second analog signal to a second digital signal in response to a second reference signal; and providing said first and said second reference signals via a local oscillator.

61. The invention of claim 60 further including the step of providing said first reference signal via a direct digital synthesizer having the output of said local oscillator as an input thereof.

62. The invention of claim 60 further including the step of providing said second reference signal via a direct digital synthesizer having the output of said local oscillator as an input thereof.

* * * * *